United States Patent
Then et al.

(10) Patent No.: US 11,521,964 B2
(45) Date of Patent: Dec. 6, 2022

(54) SCHOTTKY DIODE STRUCTURES AND INTEGRATION WITH III-V TRANSISTORS

(71) Applicant: Intel Corporation, Santa Clara, CA (US)

(72) Inventors: Han Wui Then, Portland, OR (US); Paul Fischer, Portland, OR (US); Walid Hafez, Portland, OR (US); Marko Radosavljevic, Portland, OR (US); Sansaptak Dasgupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1013 days.

(21) Appl. No.: 16/024,705

(22) Filed: Jun. 29, 2018

(65) Prior Publication Data

US 2020/0006322 A1 Jan. 2, 2020

(51) Int. Cl.
*H01L 27/06* (2006.01)
*H01L 29/872* (2006.01)
*H01L 21/8252* (2006.01)
*H01L 29/205* (2006.01)
*H01L 29/20* (2006.01)
*H01L 27/02* (2006.01)
*H01L 29/778* (2006.01)

(52) U.S. Cl.
CPC ...... *H01L 27/0605* (2013.01); *H01L 21/8252* (2013.01); *H01L 27/0255* (2013.01); *H01L 29/2003* (2013.01); *H01L 29/205* (2013.01); *H01L 29/872* (2013.01); *H01L 29/7787* (2013.01)

(58) Field of Classification Search
None
See application file for complete search history.

(56) References Cited

U.S. PATENT DOCUMENTS

| | | | | |
|---|---|---|---|---|
| 5,583,348 A * | 12/1996 | Sundaram | ........... | H01L 27/0664 257/477 |
| 6,429,468 B1 * | 8/2002 | Hsu | ..................... | H01L 29/7785 257/190 |
| 7,759,700 B2 * | 7/2010 | Ueno | .................. | H01L 29/7787 438/176 |
| 7,851,825 B2 * | 12/2010 | Suh | ..................... | H01L 29/7786 257/E21.409 |

(Continued)

*Primary Examiner* — Bilkis Jahan
(74) *Attorney, Agent, or Firm* — Schwabe, Williamson & Wyatt, P.C.

(57) ABSTRACT

Embodiments herein describe techniques, systems, and method for a semiconductor device. Embodiments herein may present a semiconductor device having a channel area including a channel III-V material, and a source area including a first portion and a second portion of the source area. The first portion of the source area includes a first III-V material, and the second portion of the source area includes a second III-V material. The channel III-V material, the first III-V material and the second III-V material may have a same lattice constant. Moreover, the first III-V material has a first bandgap, and the second III-V material has a second bandgap, the channel III-V material has a channel III-V material bandgap, where the channel material bandgap, the second bandgap, and the first bandgap form a monotonic sequence of bandgaps. Other embodiments may be described and/or claimed.

16 Claims, 10 Drawing Sheets

(56) References Cited

U.S. PATENT DOCUMENTS

| | | | | |
|---|---|---|---|---|
| 8,076,698 | B2* | 12/2011 | Ueda | H01L 29/739 |
| | | | | 257/E29.249 |
| 9,362,335 | B2* | 6/2016 | von Malm | H01L 33/62 |
| 2007/0132037 | A1* | 6/2007 | Hoshi | H01L 29/7787 |
| | | | | 257/E29.253 |
| 2012/0280281 | A1* | 11/2012 | Bahl | H01L 29/205 |
| | | | | 257/E29.338 |
| 2013/0056744 | A1* | 3/2013 | Mishra | H01L 21/76 |
| | | | | 257/E29.252 |
| 2014/0138698 | A1* | 5/2014 | Lin | H01L 29/475 |
| | | | | 257/76 |
| 2017/0236907 | A1* | 8/2017 | Fukazawa | H01L 21/0262 |
| | | | | 257/77 |
| 2019/0081167 | A1* | 3/2019 | Chen | H01L 29/452 |
| 2019/0341381 | A1* | 11/2019 | Dutta | H01L 27/0605 |

\* cited by examiner

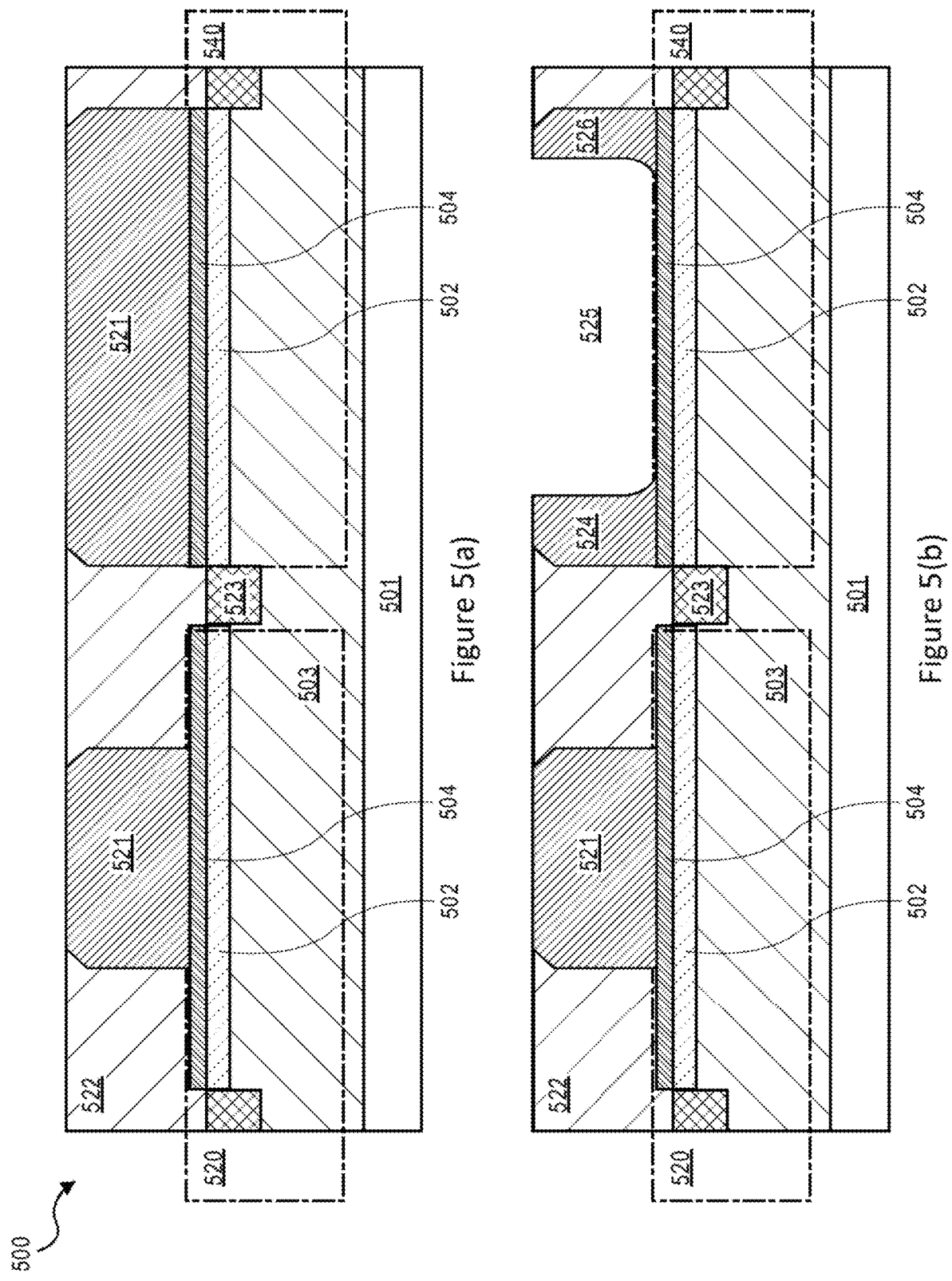

SCHOTTKY DIODE STRUCTURES AND INTEGRATION WITH III-V TRANSISTORS

FIELD

Embodiments of the present disclosure generally relate to the field of integrated circuits, and more particularly, to Schottky diode structures and integration with III-V transistors.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Traditional integrated circuits, e.g., metal-oxide-semiconductor field effect transistors (MOSFETs), may be based on silicon. On the other hand, compounds of group III-V elements may have superior semiconductor properties than silicon, including higher electron mobility and saturation velocity, leading to better performance for III-V MOSFETs, or III-V transistors. For example, III-V transistors may be used in radio frequency (RF) integrated circuits (ICs) to perform the functions for a RF system. Schottky diodes may be used at RF frontend for electrostatic discharge (ESD) protection of RF ICs. However, conventional Schottky diodes may provide limited protection for RF ICs.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIGS. 5(a)-5(f) schematically illustrate an example process for forming a semiconductor device integrating an III-V transistor and a Schottky diode with a current to flow in a vertical direction from a Schottky anode through a Schottky barrier, in accordance with some embodiments.

DETAILED DESCRIPTION

Figure 1:
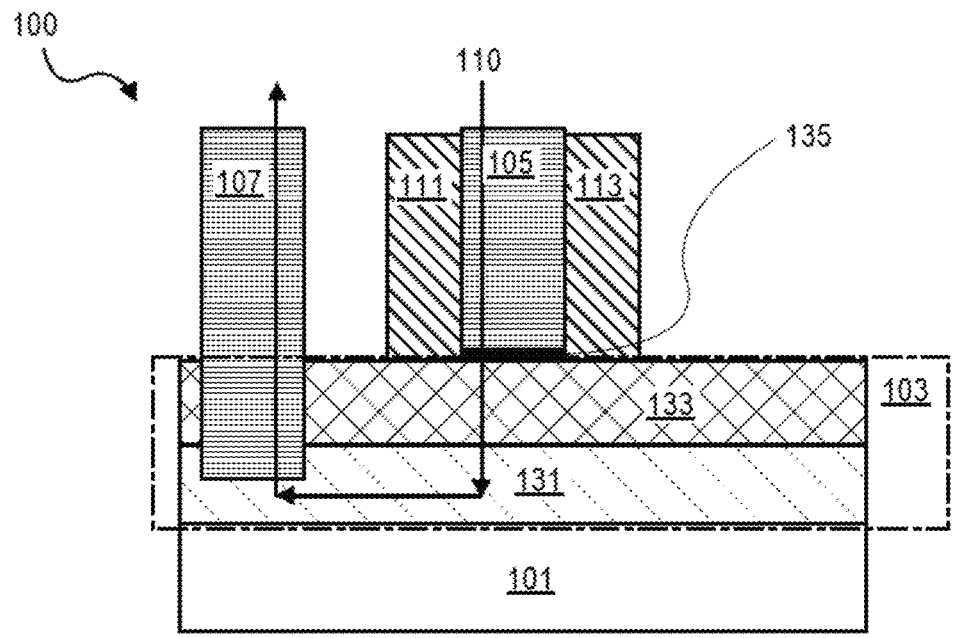
FIG. 1 schematically illustrates an example Schottky diode with a current to flow in a vertical direction from a Schottky anode through a Schottky barrier, in accordance with some embodiments.

High electron mobility transistors (HEMTs) may be used in advanced communications applications such as radio frequency (RF) applications and power electronic devices. HEMTs may be formed using compounds of group III-V elements, such as GaAs, AlGaAs, or GaN. GaN HEMTs, or simply GaN transistors, may be considered as one of the leading candidates for high efficiency power switching applications or for high-speed RF communications. Schottky diodes may be used at RF frontend for electrostatic discharge (ESD) protection of RF integrated circuits (ICs). Typically, in a GaN IC or an IC including other III-V transistors, a Schottky diode may have a current flowing in a lateral direction through a two-dimensional electron gas (2DEG) layer from one end to another end of the 2DEG layer. However, saturation of the 2DEG layer at high electrical fields may limit the maximum current protected by a Schottky diode.

Embodiments herein may include a Schottky diode with a current to flow in a vertical direction from a Schottky anode through a Schottky barrier, instead of in lateral direction through a 2DEG layer. A Schottky stack may include a first layer above a substrate, and a second layer above the first layer, where the first layer includes an III-V material, and the second layer is a polarization layer. A Schottky barrier may exist at an interface between a Schottky anode and the second layer of the Schottky stack. A current may flow in a vertical direction from the Schottky anode through the Schottky barrier. The Schottky diode may be a bulk-like diode with an ESD diode current higher than a current in a lateral direction through a 2DEG layer of a Schottky diode. In addition, the Schottky diode can be monolithically integrated with III-V transistors on the same chip, with smaller parasitic capacitances, improved circuit performance, and reduced area and costs.

Embodiments herein may present a semiconductor device. The semiconductor device may include a Schottky stack including a first layer above a substrate, and a second layer above the first layer. The first layer includes an III-V material, and the second layer is a polarization layer. A Schottky anode may be in contact with the second layer to form a Schottky barrier at an interface between the Schottky anode and the second layer of the Schottky stack. A cathode may be through the second layer of the Schottky stack and in contact with the first layer of the Schottky stack. A current is to flow in a vertical direction orthogonal to a surface of the substrate from the Schottky anode through the Schottky barrier, and vertically through the second layer to the first layer of the Schottky stack, following the first layer of the Schottky stack in a horizontal direction to the cathode.

Embodiments herein may present a method for forming a semiconductor device integrating an III-V transistor and a Schottky diode with a current to flow from a Schottky anode through a Schottky barrier in a vertical direction. The method may include forming a channel base including a layer of GaN above a substrate. The method may further include forming a channel stack above the channel base, where the channel stack includes a layer of GaN in the channel stack, and a polarization layer above the layer of GaN in the channel stack. The channel stack includes a first portion as a channel area of an III-V transistor, and a second portion separated from the first portion by an isolation area.

The method may further including forming a Schottky stack including a first layer above the second portion of the channel stack, and a second layer above the first layer, where the first layer includes an III-V material, and the second layer is a polarization layer. Moreover, the method may include forming a Schottky anode in contact with the second layer to form a Schottky barrier at an interface between the Schottky anode and the second layer of the Schottky stack. In addition, the method may include forming a cathode through the second layer of the Schottky stack and in contact with the first layer of the Schottky stack. A current is to flow from the Schottky anode through the Schottky barrier in a vertical direction orthogonal to a surface of the substrate, and vertically through the second layer to the first layer of the Schottky stack, following the first layer of the Schottky stack in a horizontal direction to the cathode.

Embodiments herein may present a computing device. The computing device may include a processor and a memory device coupled to the processor. The memory device or the processor includes a Schottky diode. The Schottky diode may have a Schottky stack including a first layer above a substrate, and a second layer above the first layer. The first layer includes an III-V material, and the second layer is a polarization layer. A Schottky anode may be in contact with the second layer to form a Schottky barrier at an interface between the Schottky anode and the second layer of the Schottky stack. A cathode may be through the second layer of the Schottky stack and in contact with the first layer of the Schottky stack. A current is to flow from the Schottky anode through the Schottky barrier in a vertical direction orthogonal to a surface of the substrate, and vertically through the second layer to the first layer of the Schottky stack, following the first layer of the Schottky stack in a horizontal direction to the cathode.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO$_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO$_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates an example Schottky diode 100 with a current to flow in a vertical direction from a Schottky anode 105 through a Schottky barrier 135, in accordance with some embodiments. For clarity, features of the Schottky diode 100, the Schottky anode 105, and the Schottky barrier 135, may be described below as examples for understanding a Schottky diode, a Schottky anode, and a Schottky barrier. Further, it is to be understood that one or more of the components of a Schottky diode, a Schottky anode, and a Schottky barrier may include additional and/or varying features from the description below, and may include any device that one having ordinary skill in the art would consider and/or refer to as a Schottky diode, a Schottky anode, and a Schottky barrier.

In embodiments, the Schottky diode 100 may include a substrate 101. A Schottky stack 103 may be above the substrate 101. The Schottky stack 103 includes a first layer 131 above the substrate 101, and a second layer 133 above the first layer 131. The first layer 131 includes an III-V material, and the second layer 133 is a polarization layer. The Schottky anode 105 is in contact with the second layer 133 to form the Schottky barrier 135 at an interface between the Schottky anode 105 and the second layer 133 of the Schottky stack 103. The Schottky barrier 135 is in a horizontal direction in parallel to a surface of the substrate 101. A spacer 111 and a spacer 113 may be around the Schottky anode 105, adjacent to a sidewall of the Schottky anode 105 and above the Schottky stack 103. A cathode 107 may be through the second layer 133 of the Schottky stack 103 and in contact with the first layer 131. When the Schottky diode 100 is in ON state, a current 110 is to flow in a vertical direction orthogonal to a surface of the substrate 101, from the Schottky anode 105 through the Schottky barrier 135, and vertically through the second layer 133 to the first layer 131 of the Schottky stack 103, following the first layer 131 in a horizontal direction to the cathode 107.

In embodiments, the first layer 131 includes an III-V material, e.g., indium (In), phosphorus (P), gallium (Ga), or arsenic (As), Ge, SiGe, GaAs, $In_xGa_{1-x}As$, $In_xGa_{1-x}N$ where x is between 0 and 1, InSb, GaN, InAs, GaP, InGaP, or InP. In addition, the first layer 131 may include n-type dopant. The second layer 133 may include AlInGaN, $Al_xIn_yGa_{1-x-y}N$, or AlN.

In embodiments, the Schottky anode 105 or the cathode 107 may be formed as a single layer or a stacked layer using one or more conductive films including a conductive material. For example, the Schottky anode 105 or the cathode 107 may include a metallic material, a conductive polymer, a polysilicon, a titanium silicide, a phosphorus (n+) doped Si, a boron doped SiGe, or an alloy of a semiconductor material and a metal. For example, the Schottky anode 105 or the cathode 107 may include gold (Au), platinum (Pt), ruthenium (Ru), iridium (Ir), titanium (Ti), aluminum (Al), molybdenum (Mo), copper (Cu), tantalum (Ta), tungsten (W), nickel (Ni), chromium (Cr), hafnium (Hf), indium (In), or an alloy of Ti, Mo, Au, Pt, Al Ni, Cu, Cr, TiAlN, HfAlN, or InAlO. The Schottky anode 105 or the cathode 107 may include tantalum nitride (TaN), titanium nitride (TiN), iridium-tantalum alloy (Ir—Ta), indium-tin oxide (ITO), the like, and/or a combination thereof. In some embodiments, the materials used for the Schottky anode 105 may include Pt, Ni, W, or alloy of TiN, TiAlN, or stack of these metals. On the other hand, the materials used for the cathode 107 may include Ti, Mo, Au, Al, Cu, Cr, or alloy of these.

In embodiments, the substrate 101 may be a silicon substrate, a glass substrate, such as soda lime glass or borosilicate glass, a metal substrate, a plastic substrate, a polyimide substrate, or other suitable substrate. The substrate 101 may include silicon, sapphire, SiC, GaN, or AlN. For example, the substrate 101 may be a silicon substrate with a (111), (100), or (110) crystal plane as a principal plane. Additionally and alternatively, the substrate 101 may include a high-resistivity p-type or n-type vicinal silicon material, germanium, germanium on silicon, gallium arsenide (GaAs), or a silicon-on-insulator substrate.

Figure 2:
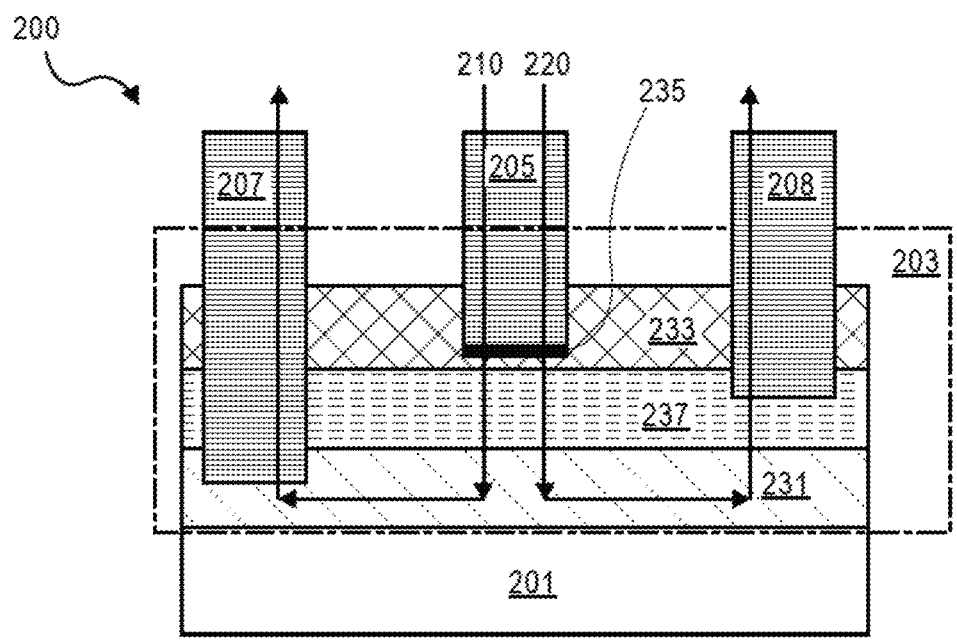
FIG. 2 schematically illustrates another example Schottky diode with a current to flow in a vertical direction from a Schottky anode through a Schottky barrier, in accordance with some embodiments.

FIG. 2 schematically illustrates another example Schottky diode 200 with a current to flow in a vertical direction from a Schottky anode 205 through a Schottky barrier 235, in accordance with some embodiments. In embodiments, the Schottky diode 200, the Schottky anode 205, and the Schottky barrier 235, may be similar to the Schottky diode 100, the Schottky anode 105, and the Schottky barrier 135, respectively, as shown in FIG. 1.

In embodiments, the Schottky diode 200 may include a substrate 201. A Schottky stack 203 may be above the substrate 201. The Schottky stack 203 includes a first layer 231 above the substrate 201, a second layer 233 above the first layer 231. The first layer 231 includes an material, and the second layer 233 is a polarization layer. In addition, the Schottky stack 203 includes a third layer 237 with an material, where the third layer 237 of the Schottky stack 203 is between the first layer 231 and the second layer 233 of the Schottky stack 203. The Schottky anode 205 is in contact with the second layer 233 to form the Schottky barrier 235 at an interface between the Schottky anode 205 and the second layer 233 of the Schottky stack 203. The Schottky barrier 235 is a horizontal plane or interface that is parallel to a surface of the substrate 201. In addition, the Schottky anode 205 is partially embedded into the second layer 233 of the Schottky stack 203. Spacers, not shown, may be around the Schottky anode 105.

In embodiments, a cathode 207 may be through the second layer 233, through the third layer 237 of the Schottky stack 203, and in contact with the first layer 231. When the Schottky diode 200 is in ON state, a current 210 is to flow in a vertical direction orthogonal to a surface of the substrate 201, from the Schottky anode 205 through the Schottky barrier 235, and vertically through the second layer 233, the third layer 237, to the first layer 231 of the Schottky stack 203, following the first layer 231 in a horizontal direction to the cathode 207.

In embodiments, a cathode 207 may be a first cathode, and the Schottky diode 200 further includes a second cathode, a cathode 208. The cathode 208 may be through the second layer 233, through the third layer 237 of the Schottky stack 203, and in contact with the first layer 231. When the Schottky diode 200 is in ON state, a current 220 is to flow in a vertical direction orthogonal to a surface of the substrate 201, from the Schottky anode 205 through the Schottky barrier 235, and vertically through the second layer 233, the third layer 237, to the first layer 231 of the Schottky stack 203, following the first layer 231 in a horizontal direction to the cathode 208.

Figure 3:
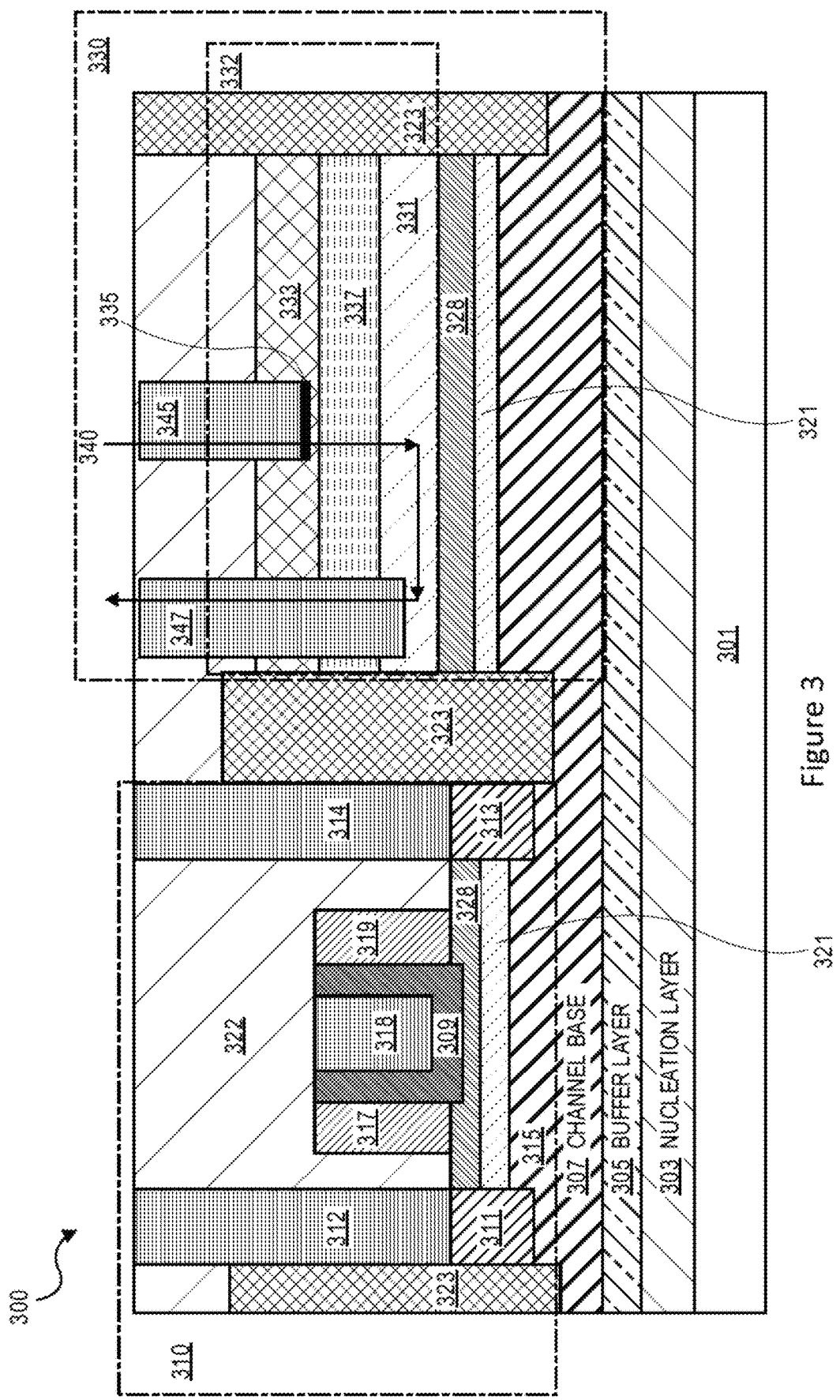
FIG. 3 schematically illustrates a semiconductor device integrating an III-V transistor and a Schottky diode with a current to flow in a vertical direction from a Schottky anode through a Schottky barrier, in accordance with some embodiments.

FIG. 3 schematically illustrates a semiconductor device 300 integrating an transistor 310 and a Schottky diode 330 with a current to flow in a vertical direction from a Schottky anode 345 through a Schottky barrier 335, in accordance with some embodiments. The Schottky diode 330 may be an example of the Schottky diode 100 in FIG. 1, or the Schottky diode 200 in FIG. 2.

In embodiments, the semiconductor device 300 may include the III-V transistor 310 and the Schottky diode 330 separated by an isolation area 323. Both the III-V transistor 310 and the Schottky diode 330 are above a substrate 301, a nucleation layer 303 over the substrate 301, a buffer layer 305 above nucleation layer 303, and a channel base layer 307. The buffer layer 303 and the nucleation layer 305 may be optional. Additionally and alternatively, there may be multiple buffer layers and/or nucleation layers between the substrate 301 and the channel base layer 307. The channel base layer 307 may be above the buffer layer 305 and include GaN. Other III-V material may be used instead of GaN as well to be the channel base layer 307. The isolation area 323 divides the channel base layer 307 into two portions, where the III-V transistor 310 is above a first portion of the channel base layer 307 and the Schottky diode 330 is above a second portion of channel base layer 307.

In embodiments, the III-V transistor 310 may be above the channel base layer 307. The III-V transistor 310 includes a channel stack above the channel base layer 307. The channel stack may include a layer of III-V material 315, and a polarization layer above the layer of III-V material 315. A 2DEG layer, not shown, may be formed at an interface between the layer of III-V material 315 and the polarization layer. The 2DEG layer may be a sheet of mobile electrons in the top 1-2 nm of the layer of III-V material 315 close to the interface. The polarization layer may include a layer of AlInGaN 328 or a layer of AlN 321. In some embodiments, the polarization layer may include both the layer of AlInGaN 328 and the layer of AlN 321, or only one of them. In some other embodiments, other polarization layer may be used as well. In some embodiments, the layer of AlInGaN 328 may include $Al_xIn_yGa_{1-x-y}N$, where x may be in a range of about 70% and 95%, y may be in a range of about 0% to 20%, and 1-x-y may be in a range of about 0% to 30%. The channel stack including the layer of III-V material 315, the polarization layer including the layer of AlInGaN 328 and the layer of AlN 321, may be next to a source area 311 and a drain area 313. A source electrode 312 may be in contact with the source area 311, and a drain electrode 314 may be in contact with the drain area 313. In addition, a gate electrode 318 may be above the polarization layer, e.g., the layer of AlInGaN 328, and separated by a gate dielectric layer 309. A spacer 317 and a spacer 319 may be adjacent to the dielectric layer 309. The source electrode 312, the drain electrode 314, and the gate electrode 318 may be within an ILD layer 322.

In embodiments, the Schottky diode 330 may be above the second portion of the channel base layer 307. In some embodiments, the Schottky diode 330 may be above the polarization layer formed for the III-V transistor 310, e.g., the layer of AlInGaN 328 and the layer of AlN 321 separated from the same layers of the III-V transistor 310 by the isolation area 323. In some other embodiments, the Schottky diode 330 may be above the second portion of the channel base layer 307 without being above the polarization layer.

In embodiments, the Schottky diode 330 includes a Schottky stack 332. The Schottky stack 332 includes a first layer 331, a second layer 333 above the first layer 331. The first layer 331 includes an III-V material, and the second layer 333 is a polarization layer. In addition, the Schottky stack 332 may further include a third layer 337 with an III-V material, where the third layer 337 of the Schottky stack 332 is between the first layer 331 and the second layer 333 of the Schottky stack 332. The Schottky anode 345 is in contact with the second layer 333 to form the Schottky barrier 335 at an interface between the Schottky anode 345 and the second layer 333 of the Schottky stack 332. The Schottky barrier 335 is a horizontal plane or interface that is parallel to a surface of the substrate 301. In addition, the Schottky anode 345 is partially embedded into the second layer 333 of the Schottky stack 303. Spacers, not shown, may be around the Schottky anode 345. A cathode 347 may be through the second layer 333, through the third layer 337 of the Schottky stack 332, and in contact with the first layer 331. When the Schottky diode 330 is in ON state, a current 340 is to flow in a vertical direction orthogonal to a surface of the substrate 301, from the Schottky anode 345 through the Schottky barrier 335, and vertically through the second layer 333, the third layer 337, to the first layer 331 of the Schottky stack 332, following the first layer 331 in a horizontal direction to the cathode 347.

Figure 4:
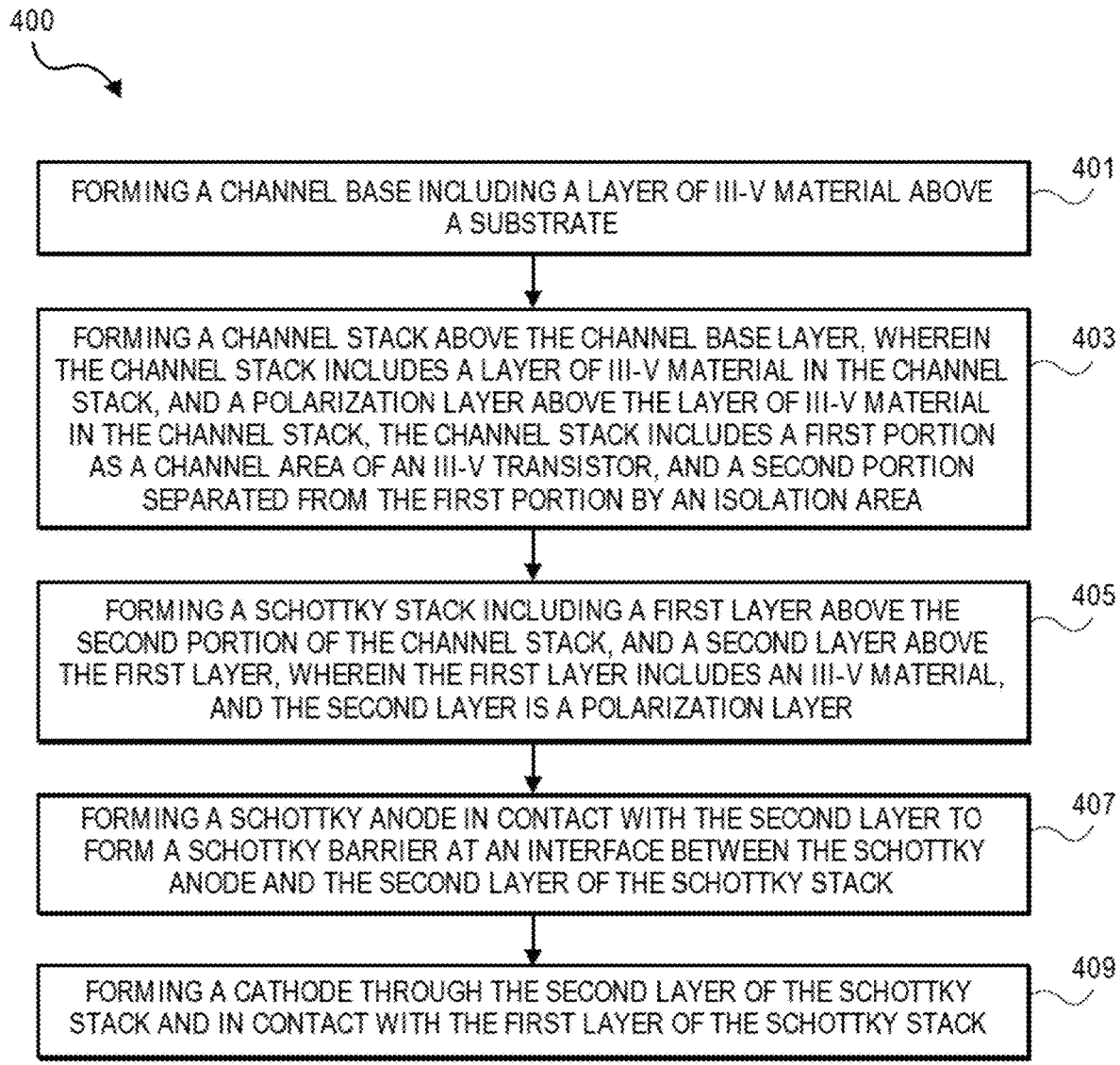
FIG. 4 schematically illustrates an example process for forming a semiconductor device integrating an III-V transistor and a Schottky diode with a current to flow in a vertical direction from a Schottky anode through a Schottky barrier, in accordance with some embodiments.

FIG. 4 schematically illustrates an example process 400 for forming a semiconductor device integrating an III-V transistor and a Schottky diode with a current to flow in a vertical direction from a Schottky anode through a Schottky barrier, in accordance with some embodiments. In embodiments, the process 400 may be used to form the semiconductor device 300 integrating the III-V transistor 310 and the Schottky diode 330 with a current to flow in a vertical direction from the Schottky anode 345 through the Schottky barrier 335, as shown in FIG. 3.

At block 401, the process 400 may include forming a channel base layer including a layer of III-V material above a substrate. For example, as shown in FIG. 3, the process 400 may include forming the channel base layer 307 including a layer of III-V material, e.g., GaN, above the substrate 301.

At block 403, the process 400 may include forming a channel stack above the channel base layer, wherein the channel stack includes a layer of III-V material in the channel stack, and a polarization layer above the layer of III-V material in the channel stack. The channel stack includes a first portion as a channel area of an III-V transistor, and a second portion separated from the first portion by an isolation area. For example, as shown in FIG. 3, the process 400 may include forming the channel stack above the channel base layer 307, where the channel stack includes the layer of III-V material 315 in the channel stack, and a polarization layer above the layer of III-V material in the channel stack, where the polarization layer includes the layer of AlInGaN 328 and the layer of AlN 321. The channel stack includes a first portion as a channel area of the III-V transistor 310, and a second portion separated from the first portion by the isolation area 323.

At block 405, the process 400 may include forming a Schottky stack including a first layer above the second portion of the channel stack, and a second layer above the first layer, wherein the first layer includes an III-V material, and the second layer is a polarization layer. For example, as shown in FIG. 3, the process 400 may include forming the Schottky stack 332 including a first layer 331 above the second portion of the channel stack, and the second layer 333 above the first layer 331.

At block 407, the process 400 may include forming a Schottky anode in contact with the second layer to form a Schottky barrier at an interface between the Schottky anode and the second layer of the Schottky stack. For example, as shown in FIG. 3, the process 400 may include forming the Schottky anode 345 in contact with the second layer 333 to form the Schottky barrier 335 at an interface between the Schottky anode 345 and the second layer 333 of the Schottky stack 332.

At block 409, the process 400 may include forming a cathode through the second layer of the Schottky stack and in contact with the first layer of the Schottky stack. For example, as shown in FIG. 3, the process 400 may include forming the cathode 347 through the second layer 333 of the Schottky stack 332 and in contact with the first layer 331 of the Schottky stack 332. The current 340 is to flow from the Schottky anode 345 through the Schottky barrier 335 in a vertical direction orthogonal to a surface of the substrate 301, and vertically through the second layer 333 to the first layer of 331 the Schottky stack 332, following the first layer 331 of the Schottky stack 332 in a horizontal direction to the cathode 347.

In embodiments, in addition, the process 400 may include forming a gate electrode above the first portion of the channel stack, and separated from the first portion of the channel stack by a gate dielectric layer; forming a source area through the channel stack and adjacent to a first end of the first portion of the channel stack; and forming a drain area through the channel stack and adjacent to a second end of the first portion of the channel stack opposite to the first end. For example, as shown in FIG. 3, the process 400 may include the gate electrode 318 above the first portion of the channel stack, and separated from the first portion of the channel stack by the gate dielectric layer 309; forming the source area 311 through the channel stack and adjacent to a first end of the first portion of the channel stack; and forming the drain area 313 through the channel stack and adjacent to a second end of the first portion of the channel stack opposite to the first end.

FIGS. 5(a)-5(f) schematically illustrate an example process 500 for forming a semiconductor device integrating an III-V transistor and a Schottky diode with a current to flow in a vertical direction from a Schottky anode through a Schottky barrier, in accordance with some embodiments. In embodiments, the process 400 may be used to form the semiconductor device 300 integrating the III-V transistor 310 and the Schottky diode 330 with a current to flow in a vertical direction from the Schottky anode 345 through the Schottky barrier 335, as shown in FIG. 3.

As illustrated in FIG. 5(a), the process 500 may include forming a channel base layer 503 above a substrate 501, forming one or more polarization layers above the channel base layer 503. The polarization layers may include a layer of AlInGaN 504 and a layer of AlN 502. A 2DEG layer, not shown, may be formed at an interface between the polarization layers and the channel base layer 503. The process 500 may further include forming an isolation area 523 to separate the channel base layer 503, and the polarization layers into two portions, a first portion 520 and a second portion 540. An III-V transistor will be formed based on the first portion 520 and a Schottky diode will be formed above the second portion 540. The process 500 may further include forming an ILD layer 522 above the polarization layer 504, and a spacer 521 over the polarization layer 504 within the first portion 520, and a spacer 521 over the polarization layer 504 within the second portion 540. The spacer 521 over the polarization layer 504 within the first portion 520 and the spacer 521 over the polarization layer 504 within the second portion 540 may be formed at the same time, or at different times.

As illustrated in FIG. 5(b), the process 500 may include forming an opening 525 at the spacer 521 over the polarization layer 504 within the second portion 540, while keeping two remaining parts of the spacer, e.g., a spacer part 524 and a spacer part 526.

Figure 5C:
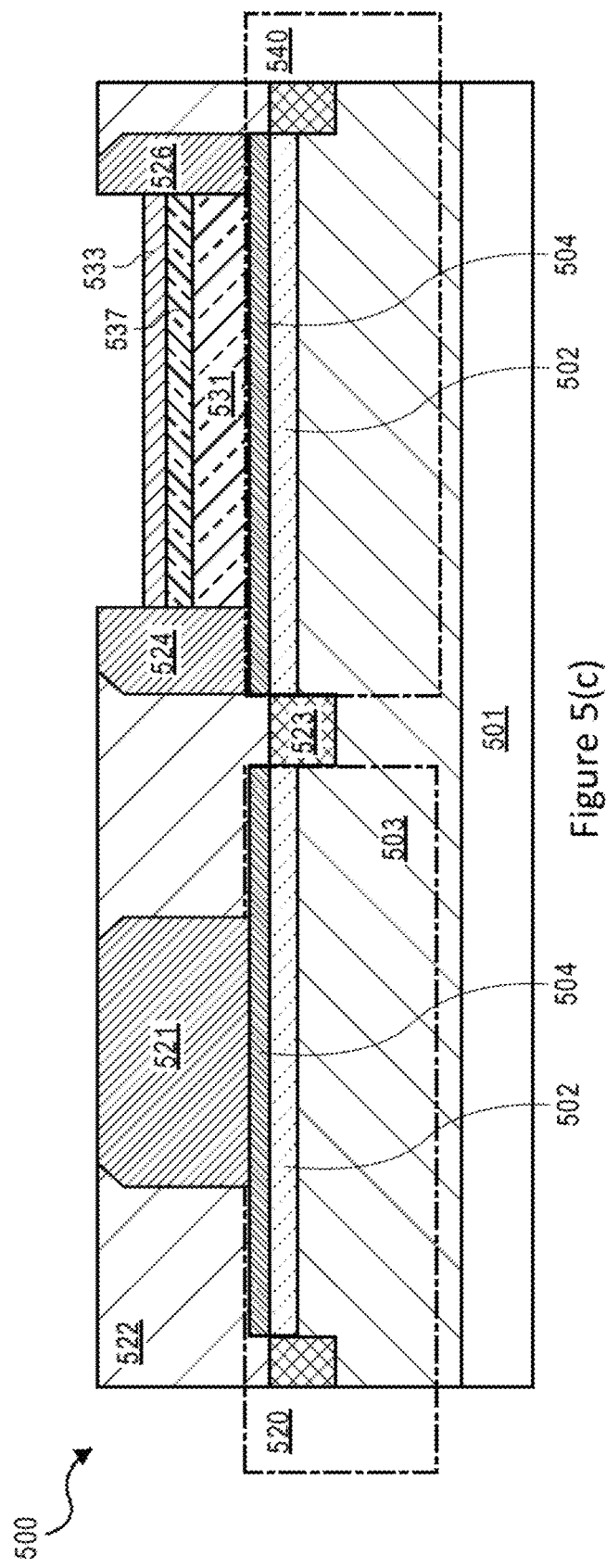

As illustrated in FIG. 5(c), the process 500 may include forming a Schottky stack within the opening 525 formed in FIG. 5(b). In embodiments, the Schottky stack may include a first layer 531 including an III-V material above the second portion 540 of the channel base layer 503, a second layer 533 above the first layer 531, where the second layer is a polarization layer. In addition, the Schottky stack may include a third layer 537 with an III-V material separating the first layer 531 and the second layer 533.

Figure 5D:
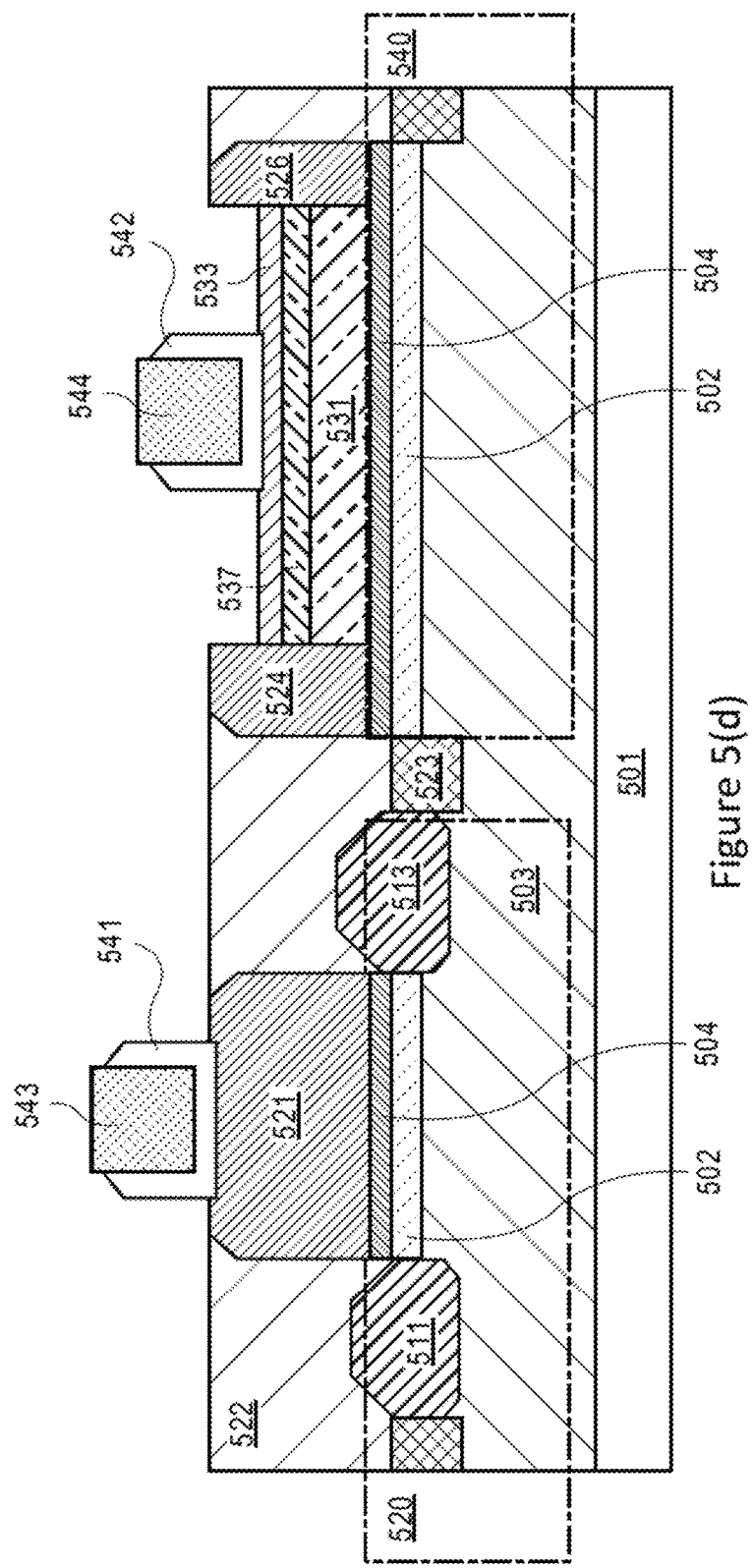

As illustrated in FIG. 5(d), the process 500 may include forming a dummy gate 543 above the spacer 521, where the dummy gate 543 is surrounded by a dielectric layer 541. Similarly, a dummy gate 544 may be formed above the Schottky stack, e.g., the second layer 533, where the dummy gate 544 is surrounded by a dielectric layer 542. The process 500 may further include forming a source area 511 and a drain area 513. The source area 511 may be through the polarization layer of AlInGaN 504 and the layer of AlN 502 and adjacent to a first end of the polarization layer of AlInGaN 504 and the layer of AlN 502. The drain area 513 may be through the polarization layer of AlInGaN 504 and the layer of AlN 502 and adjacent to a second end of the polarization layer of AlInGaN 504 and the layer of AlN 502 opposite to the first end.

Figure 5E:
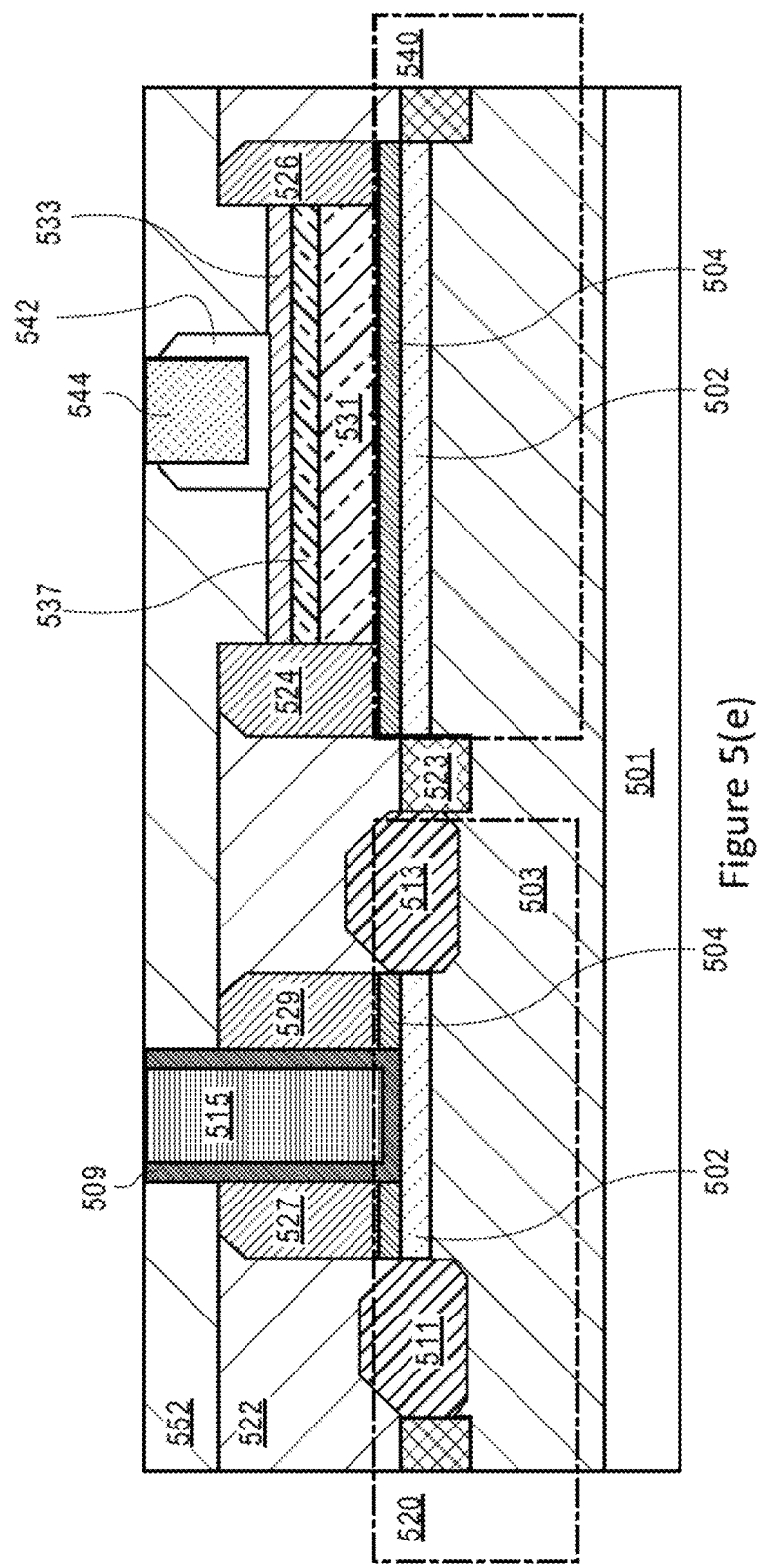

As illustrated in FIG. 5(e), the process 500 may include removing the dummy gate 543 and the dielectric layer 541 above the spacer 521. Afterwards, the process 500 may include forming a gate electrode 515 above the first portion 520 of the channel base layer 503, and the polarization layer of AlInGaN 504 and the layer of AlN 502. The gate electrode 515 is separated from the layer of AlInGaN 504 by a gate dielectric layer 509. The gate electrode 515 and the gate dielectric layer 509 are embedded into the spacer 521 to separate the spacer into two parts—a spacer part 527 and a spacer part 529. The gate electrode 515 and the gate dielectric layer 509 may be above the polarization layer of AlInGaN 504 and the layer of AlN 502. In some other embodiments, the gate electrode 515 and the gate dielectric layer 509 may be partially through the polarization layer of AlInGaN 504 or the layer of AlN 502. Another ILD layer 552 may be formed above the spacer part 527 and the spacer part 529, to be coplanar with a surface of the dummy gate 544 in the second portion 540.

Figure 5F:
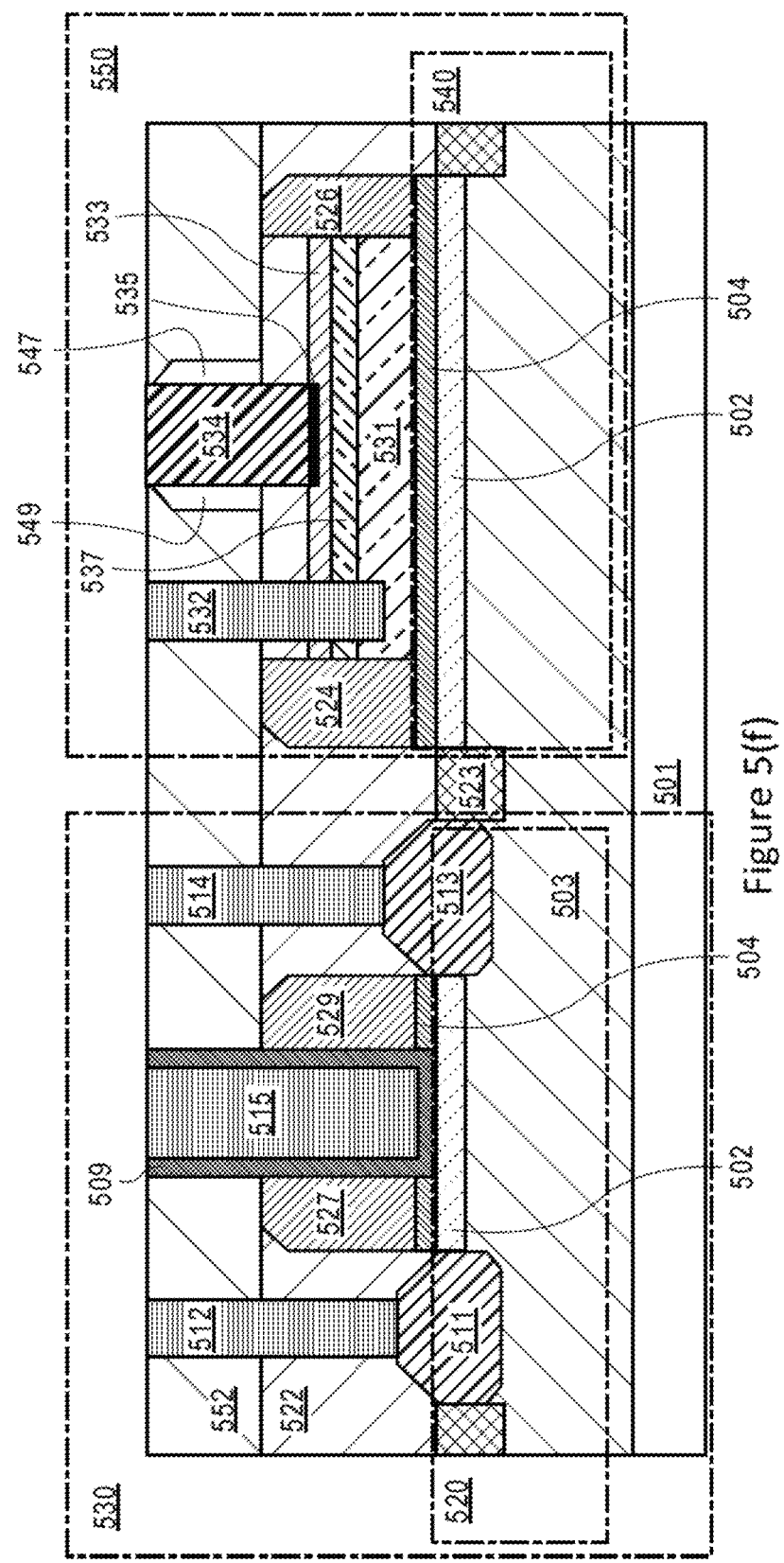

As illustrated in FIG. 5(f), the process 500 may include forming a source electrode 512 coupled to the source area 511, and forming a drain electrode 514 coupled to the drain area 513, forming a Schottky anode 534 in contact with the second layer 533 to form the Schottky barrier 535 at an interface between the Schottky anode 534 and the second layer 533. The process 500 may also form a cathode 532 through the second layer 533, through the third layer 537, and in contact with the first layer 531. As a result of the process 500, an III-V transistor 530 and a Schottky diode 550 are formed and separated by the isolation area 523.

Figure 6:
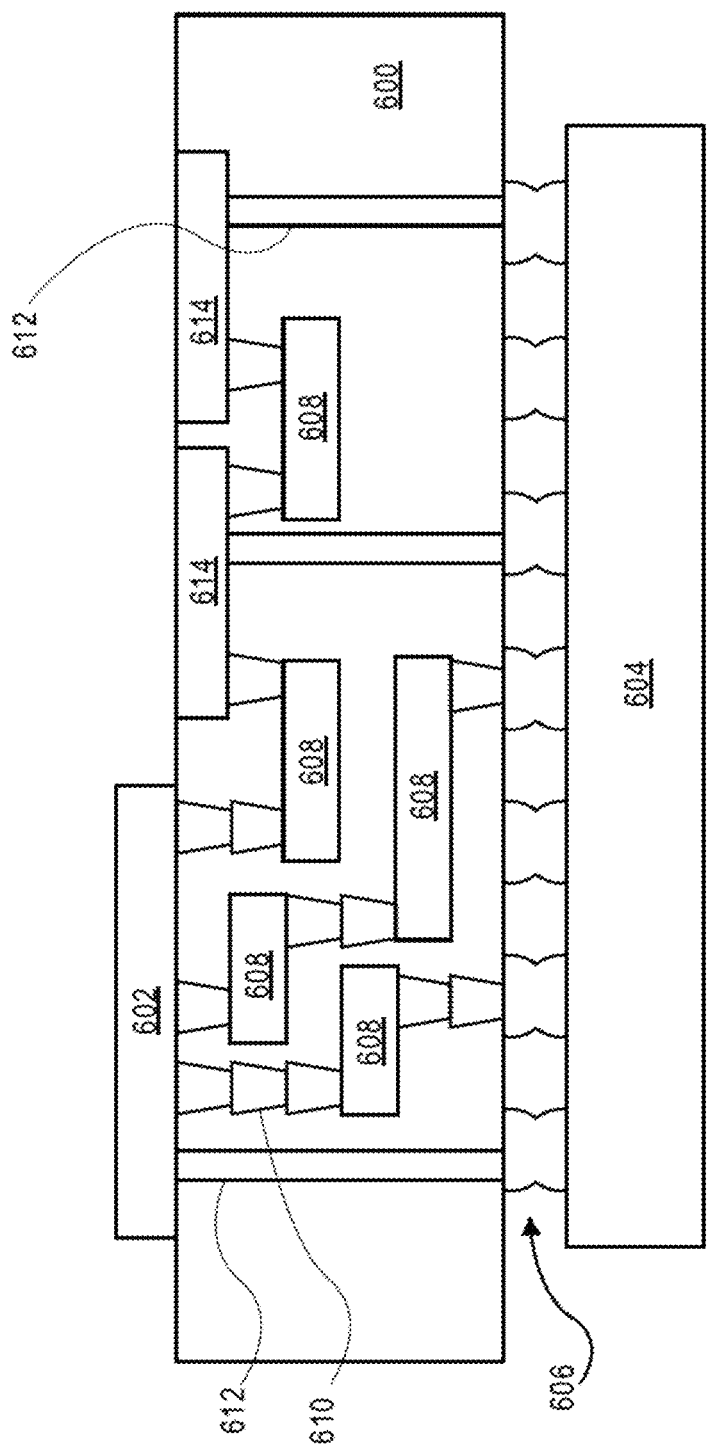
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 is an intervening substrate used to bridge a first substrate 602 to a second substrate 604. The first substrate 602 may be, for instance, a substrate support the Schottky diode 100 shown in FIG. 1, the Schottky diode 200 shown in FIG. 2, the Schottky diode 330 shown in FIG. 3, the III-V transistor 310 shown in FIG. 3, the III-V transistor 530 shown in FIG. 5(e), or the Schottky diode 550 shown in FIG. 5(e). The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices, such as the Schottky diode 100 shown in FIG. 1, the Schottky diode 200 shown in FIG. 2, the Schottky diode 330 shown in FIG. 3, the III-V transistor 310 shown in FIG. 3, the III-V transistor 530 shown in FIG. 5(e), or the Schottky diode 550 shown in FIG. 5(e). More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
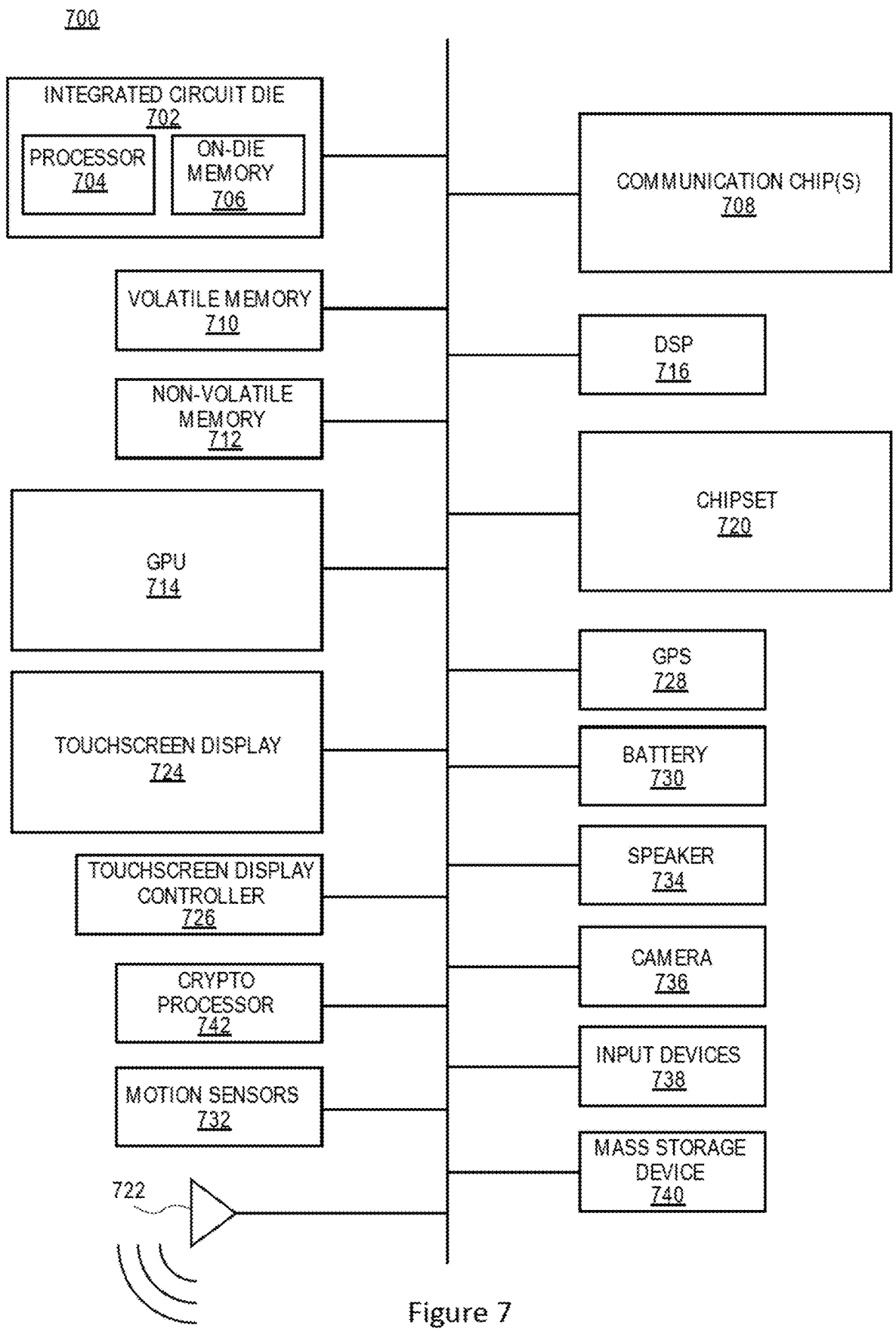
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. For example, the processor 704 or the on-die memory 706, or other control circuits in the integrated circuit die 702 may include the Schottky diode 100 shown in FIG. 1, the Schottky diode 200 shown in FIG. 2, the Schottky diode 330 shown in FIG. 3, the III-V transistor 310 shown in FIG. 3, the III-V transistor 530 shown in FIG. 5(e), or the Schottky diode 550 shown in FIG. 5(e).

In embodiments, the computing device 700 may include a display or a touchscreen display 724, and a touchscreen display controller 726. A display or the touchscreen display 724 may include a FPD, an AMOLED display, a TFT LCD, a micro light-emitting diode (µLED) display, or others.

Computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit 714 (GPU), a digital signal processor (DSP) 716, a crypto processor 742 (e.g., a specialized processor that executes cryptographic algorithms within hardware), a chipset 720, at least one antenna 722 (in some implementations two or more antenna may be used), a battery 730 or other power source, a power electronic device 731, a voltage regulator (not shown), a global positioning system (GPS) device 728, a compass, a motion coprocessor or sensors 732 (that may include an accelerometer, a gyroscope, and a compass), a microphone (not shown), a speaker 734, a resonator 735, a camera 736, user input devices 738 (such as a keyboard, mouse, stylus, and touchpad), and a mass storage device 740 (such as hard disk drive, compact disk (CD), digital versatile disk (DVD), and so forth). In embodiments, various components may include the Schottky diode 100 shown in FIG. 1, the Schottky diode 200 shown in FIG. 2, the Schottky diode 330 shown in FIG. 3, the III-V transistor 310 shown in FIG. 3, the III-V transistor 530 shown in FIG. 5(e), or the Schottky diode 550 shown in FIG. 5(e).

The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In further embodiments, another component housed within the computing device 700 may contain one or more devices, such as the power electronic device 731, that are formed in accordance with implementations of the current disclosure, e.g., the Schottky diode 100 shown in FIG. 1, the Schottky diode 200 shown in FIG. 2, the Schottky diode 330 shown in FIG. 3, the III-V transistor 310 shown in FIG. 3, the III-V transistor 530 shown in FIG. 5(e), or the Schottky diode 550 shown in FIG. 5(e).

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some non-limiting Examples are provided below.

Example 1 may include a semiconductor device, comprising: a Schottky stack including a first layer above a substrate, and a second layer above the first layer, wherein the first layer includes an III-V material, and the second layer is a polarization layer; a Schottky anode in contact with the second layer to form a Schottky barrier at an interface between the Schottky anode and the second layer of the Schottky stack; and a cathode through the second layer of the Schottky stack and in contact with the first layer of the Schottky stack, wherein a current is to flow from the Schottky anode through the Schottky barrier in a vertical direction orthogonal to a surface of the substrate, and vertically through the second layer to the first layer of the Schottky stack, following the first layer of the Schottky stack in a horizontal direction to the cathode.

Example 2 may include the semiconductor device of example 1 and/or some other examples herein, wherein the Schottky anode is partially embedded into the second layer of the Schottky stack.

Example 3 may include the semiconductor device of example 1 and/or some other examples herein, wherein the second layer of the Schottky stack includes a material selected from the group consisting of AlInGaN, $Al_xIn_yGa_{1-x-y}N$, and AlN.

Example 4 may include the semiconductor device of example 1 and/or some other examples herein, wherein the first layer of the Schottky stack includes n-type dopant.

Example 5 may include the semiconductor device of example 1 and/or some other examples herein, wherein the III-V material of the first layer of the Schottky stack includes a material selected from the group consisting of indium (In), phosphorus (P), gallium (Ga), or arsenic (As), Ge, SiGe, GaAs, $In_xGa_{1-x}As$, $In_xGa_{1-x}N$ where x is between 0 and 1, InSb, GaN, InAs, GaP, InGaP, and InP.

Example 6 may include the semiconductor device of example 1 and/or some other examples herein, wherein the Schottky anode or cathode includes a material selected from the group consisting of titanium (Ti), molybdenum (Mo), gold (Au), platinum (Pt), aluminum (Al), nickel (Ni), copper (Cu), chromium (Cr), and an alloy of Ti, Mo, Au, Pt, Al Ni, Cu, Cr, TiAlN, HfAlN, or InAlO.

Example 7 may include the semiconductor device of example 1 and/or some other examples herein, wherein the substrate includes a material selected from the group consisting of silicon, sapphire, SiC, GaN, and AlN.

Example 8 may include the semiconductor device of example 1 and/or some other examples herein, wherein the substrate is a silicon substrate with a (111), (100), or (110) crystal plane as a principal plane.

Example 9 may include the semiconductor device of example 1 and/or some other examples herein, wherein the Schottky stack further includes a third layer with an III-V material, the third layer of the Schottky stack is between the first layer and the second layer of the Schottky stack, and the cathode is through the third layer of the Schottky stack and in contact with the first layer of the Schottky stack.

Example 10 may include the semiconductor device of example 1 and/or some other examples herein, wherein the cathode is a first cathode, and the semiconductor device further includes a second cathode through the second layer of the Schottky stack and in contact with the first layer of the Schottky stack, a current is to flow from the Schottky anode through the Schottky barrier in the vertical direction orthogonal to the surface of the substrate, and vertically through the second layer to the first layer of the Schottky stack, following the first layer of the Schottky stack in a horizontal direction to the second cathode.

Example 11 may include the semiconductor device of example 1 and/or some other examples herein, further comprising: a spacer adjacent to a sidewall of the Schottky anode and above the Schottky stack.

Example 12 may include the semiconductor device of example 1 and/or some other examples herein, further comprising: a channel base including a layer of III-V material above the substrate, wherein the Schottky stack is above the channel base; and an III-V transistor including a channel stack above the channel base, wherein the channel stack includes a layer of III-V material in the channel stack, and a polarization layer above the layer of GaN in the channel stack.

Example 13 may include the semiconductor device of example 12 and/or some other examples herein, further comprising: a buffer layer or a nucleation layer between the substrate and the channel base.

Example 14 may include a method for forming a semiconductor device, the method comprising: forming a channel base including a layer of III-V material above a substrate; forming a channel stack above the channel base, wherein the channel stack includes a layer of III-V material in the channel stack, and a polarization layer above the layer of GaN in the channel stack, the channel stack includes a first portion as a channel of an III-V transistor, and a second portion separated from the first portion by an isolation area; forming a Schottky stack including a first layer above the second portion of the channel stack, and a second layer above the first layer, wherein the first layer includes an III-V material, and the second layer is a polarization layer; forming a Schottky anode in contact with the second layer to form a Schottky barrier at an interface between the Schottky anode and the second layer of the Schottky stack; and forming a cathode through the second layer of the Schottky stack and in contact with the first layer of the Schottky stack, wherein a current is to flow from the Schottky anode through the Schottky barrier in a vertical direction orthogonal to a surface of the substrate, and vertically through the second layer to the first layer of the Schottky stack, following the first layer of the Schottky stack in a horizontal direction to the cathode.

Example 15 may include the method of example 14 and/or some other examples herein, further comprising: forming a gate electrode above the first portion of the channel stack, and separated from the first portion of the channel stack by a gate dielectric layer; forming a source area through the channel stack and adjacent to a first end of the first portion of the channel stack; and forming a drain area through the channel stack and adjacent to a second end of the first portion of the channel stack opposite to the first end.

Example 16 may include the method of example 14 and/or some other examples herein, wherein the forming the Schottky stack further includes forming a third layer of the Schottky stack between the first layer and the second layer of the Schottky stack, the third layer includes an III-V material, and the forming the cathode includes forming the cathode through the third layer of the Schottky stack and in contact with the first layer of the Schottky stack.

Example 17 may include the method of example 14 and/or some other examples herein, further comprising: forming a spacer adjacent to a sidewall of the Schottky anode and above the Schottky stack.

Example 18 may include the method of example 14 and/or some other examples herein, further comprising: forming a buffer layer or a nucleation layer between the substrate and the channel base.

Example 19 may include the method of example 14 and/or some other examples herein, wherein the III-V material of the first layer of the Schottky stack includes a material selected from the group consisting of indium (In), phosphorus (P), gallium (Ga), or arsenic (As), Ge, SiGe, GaAs, $In_xGa_{1-x}As$, $In_xGa_{1-x}N$ where x is between 0 and 1, InSb, GaN, InAs, GaP, InGaP, and InP.

Example 20 may include the method of example 14 and/or some other examples herein, wherein the first layer of the Schottky stack includes n-type dopant.

Example 21 may include the method of example 14 and/or some other examples herein, wherein the substrate is a silicon substrate with a (111), (100), or (110) crystal plane as a principal plane.

Example 22 may include a computing device, comprising: a processor; and a memory device coupled to the processor, wherein the memory device or the processor includes a Schottky diode comprising: a Schottky stack including a first layer above a substrate, and a second layer above the first layer, wherein the first layer includes an III-V material, and the second layer is a polarization layer; a Schottky anode in contact with the second layer to form a Schottky barrier at an interface between the Schottky anode and the second layer of the Schottky stack; and a cathode through the second layer of the Schottky stack and in contact with the first layer of the Schottky stack, wherein a current is to flow from the Schottky anode through the Schottky barrier in a vertical direction orthogonal to a surface of the substrate, and vertically through the second layer to the first layer of the Schottky stack, following the first layer of the Schottky stack in a horizontal direction to the cathode.

Example 23 may include the computing device of example 22 and/or some other examples herein, wherein the memory device or the processor includes an III-V transistor comprising: a channel base including a layer of III-V material above the substrate, wherein the Schottky stack is above the channel base; and a channel stack above the channel base, wherein the channel stack includes a layer of III-V material in the channel stack, and a polarization layer above the layer of GaN in the channel stack.

Example 24 may include the computing device of example 22 and/or some other examples herein, wherein the first layer of the Schottky stack includes n-type dopant, and the III-V material of the first layer of the Schottky stack includes a material selected from the group consisting of indium (In), phosphorus (P), gallium (Ga), or arsenic (As), Ge, SiGe, GaAs, $In_xGa_{1-x}As$, $In_xGa_{1-x}N$ where x is between 0 and 1, InSb, GaN, InAs, GaP, InGaP, and InP.

Example 25 may include the computing device of example 22 and/or some other examples herein, wherein the computing device is a device selected from the group consisting of a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, and a camera coupled with the processor.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
a Schottky stack including a first layer above a substrate, and a second layer above the first layer, wherein the first layer includes an III-V material, and the second layer is a polarization layer;
a Schottky anode in contact with the second layer to form a Schottky barrier at an interface between the Schottky anode and the second layer of the Schottky stack;
a cathode through the second layer of the Schottky stack and extending into the first layer of the Schottky stack, wherein a current is to flow from the Schottky anode through the Schottky barrier in a vertical direction orthogonal to a surface of the substrate, and vertically through the second layer to the first layer of the Schottky stack, following the first layer of the Schottky stack in a horizontal direction to the cathode;
a channel base including a layer of III-V material above the substrate, wherein the Schottky stack is above the channel base; and
an III-V transistor including a channel stack above the channel base, wherein the channel stack includes a layer of III-V material in the channel stack, and a polarization layer above the layer of III-V material in the channel stack.

2. The semiconductor device of claim 1, wherein the Schottky anode is partially embedded into the second layer of the Schottky stack.

3. The semiconductor device of claim 1, wherein the second layer of the Schottky stack includes a material selected from the group consisting of AlInGaN, $Al_xIn_yGa_{1-x-y}N$, and AlN.

4. The semiconductor device of claim 1, wherein the first layer of the Schottky stack includes n-type dopant.

5. The semiconductor device of claim 1, wherein the III-V material of the first layer of the Schottky stack includes a material selected from the group consisting of indium (In), phosphorus (P), gallium (Ga), or arsenic (As), Ge, SiGe, GaAs, $In_xGa_{1-x}As$, $In_xGa_{1-x}N$ where x is between 0 and 1, InSb, GaN, InAs, GaP, InGaP, and InP.

6. The semiconductor device of claim 1, wherein the Schottky anode or cathode includes a material selected from the group consisting of titanium (Ti), molybdenum (Mo), gold (Au), platinum (Pt), aluminum (Al), nickel (Ni), copper (Cu), chromium (Cr), and an alloy of Ti, Mo, Au, Pt, Al Ni, Cu, Cr, TiAlN, HfAlN, or InAlO.

7. The semiconductor device of claim 1, wherein the substrate includes a material selected from the group consisting of silicon, sapphire, SiC, GaN, and AlN.

8. The semiconductor device of claim 1, wherein the substrate is a silicon substrate with a (111), (100), or (110) crystal plane as a principal plane.

9. The semiconductor device of claim 1, wherein the Schottky stack further includes a third layer with an III-V material, the third layer of the Schottky stack is between the first layer and the second layer of the Schottky stack, and the cathode is through the third layer of the Schottky stack and in contact with the first layer of the Schottky stack.

10. The semiconductor device of claim 1, wherein the cathode is a first cathode, and the semiconductor device further includes a second cathode through the second layer of the Schottky stack and in contact with the first layer of the Schottky stack, a current is to flow from the Schottky anode through the Schottky barrier in the vertical direction orthogonal to the surface of the substrate, and vertically through the second layer to the first layer of the Schottky stack, following the first layer of the Schottky stack in a horizontal direction to the second cathode.

11. The semiconductor device of claim 1, further comprising:
a spacer adjacent to a sidewall of the Schottky anode and above the Schottky stack.

12. The semiconductor device of claim 1, further comprising:
a buffer layer or a nucleation layer between the substrate and the channel base.

13. A computing device, comprising:
a processor; and
a memory device coupled to the processor, wherein the memory device or the processor includes a Schottky diode comprising:
a Schottky stack including a first layer above a substrate, and a second layer above the first layer, wherein the first layer includes an III-V material, and the second layer is a polarization layer;
a Schottky anode in contact with the second layer to form a Schottky barrier at an interface between the Schottky anode and the second layer of the Schottky stack; and
a cathode through the second layer of the Schottky stack and extending into the first layer of the Schottky stack, wherein a current is to flow from the Schottky anode through the Schottky barrier in a vertical direction orthogonal to a surface of the substrate, and vertically through the second layer to the first layer of the Schottky stack, following the first layer of the Schottky stack in a horizontal direction to the cathode, and wherein the memory device or the processor includes comprising:
a channel base including a layer of III-V material above the substrate, wherein the Schottky stack is above the channel base; and
a channel stack above the channel base, wherein the channel stack includes a layer of III-V material in the channel stack, and a polarization layer above the layer of III-V material in the channel stack.

14. The computing device of claim 13, wherein the first layer of the Schottky stack includes n-type dopant, and the III-V material of the first layer of the Schottky stack includes a material selected from the group consisting of indium (In), phosphorus (P), gallium (Ga), or arsenic (As), Ge, SiGe, GaAs, $In_xGa_{1-x}As$, $In_xGa_{1-x}N$ where x is between 0 and 1, InSb, GaN, InAs, GaP, InGaP, and InP.

15. The computing device of claim 13, wherein the computing device is a device selected from the group consisting of a wearable device or a mobile computing device, the wearable device or the mobile computing device including one or more of an antenna, a touchscreen controller, a battery, an audio codec, a video codec, a power amplifier, a global positioning system (GPS) device, a compass, a Geiger counter, an accelerometer, a gyroscope, a speaker, and a camera coupled with the processor.

16. A semiconductor device, comprising:
a Schottky stack including a first layer above a substrate, and a second layer above the first layer, wherein the first layer includes an III-V material, and the second layer is a polarization layer;
a Schottky anode in contact with the second layer to form a Schottky barrier at an interface between the Schottky anode and the second layer of the Schottky stack; and
a cathode through the second layer of the Schottky stack and in contact with the first layer of the Schottky stack, wherein a current is to flow from the Schottky anode through the Schottky barrier in a vertical direction orthogonal to a surface of the substrate, and vertically through the second layer to the first layer of the Schottky stack, following the first layer of the Schottky stack in a horizontal direction to the cathode, wherein the cathode is a first cathode, and the semiconductor device further includes a second cathode through the second layer of the Schottky stack and in contact with the first layer of the Schottky stack, a current is to flow from the Schottky anode through the Schottky barrier in the vertical direction orthogonal to the surface of the substrate, and vertically through the second layer to the first layer of the Schottky stack, following the first layer of the Schottky stack in a horizontal direction to the second cathode.

* * * * *